(12) United States Patent
Rannestad

(10) Patent No.: US 9,899,999 B2
(45) Date of Patent: Feb. 20, 2018

(54) GATE DRIVE UNIT WITH ANALOG MEASURING CIRCUIT

(71) Applicant: KK Wind Solutions A/S, Ikast (DK)

(72) Inventor: Bjørn Rannestad, Aalborg (DK)

(73) Assignee: KK Wind Solutions A/S, Ikast (DK)

( * ) Notice: Subject to any disclaimer, the term of this patent is extended or adjusted under 35 U.S.C. 154(b) by 0 days.

(21) Appl. No.: 14/774,446

(22) PCT Filed: Mar. 26, 2014

(86) PCT No.: PCT/DK2014/050072
§ 371 (c)(1),
(2) Date: Sep. 10, 2015

(87) PCT Pub. No.: WO2014/154221
PCT Pub. Date: Oct. 2, 2014

(65) Prior Publication Data
US 2016/0036430 A1 Feb. 4, 2016

(30) Foreign Application Priority Data

Mar. 27, 2013 (DK) .................................. 2013 00190

(51) Int. Cl.
*H02M 1/32* (2007.01)
*H03K 17/082* (2006.01)
(Continued)

(52) U.S. Cl.
CPC .......... *H03K 17/0822* (2013.01); *H02M 1/08* (2013.01); *H02M 1/32* (2013.01);
(Continued)

(58) Field of Classification Search
CPC .. H02M 2001/0003; H02M 1/08; H02M 7/53; H02M 1/32
See application file for complete search history.

(56) References Cited

U.S. PATENT DOCUMENTS

| | | | | |
|---|---|---|---|---|
| 4,992,925 A | * | 2/1991 | Meyer ................... | H02M 7/003 361/688 |
| 5,083,039 A | * | 1/1992 | Richardson ........... | F03D 7/0272 290/44 |

(Continued)

FOREIGN PATENT DOCUMENTS

| | | |
|---|---|---|
| EP | 2469710 A1 | 6/2012 |
| JP | 11261064 H | 9/1999 |

(Continued)

OTHER PUBLICATIONS

Danish Patent & Trademark Office—Search Report—Application No. PA 2013 00190—Date of Completion of Search Report: Aug. 23, 2013.

(Continued)

*Primary Examiner* — Gary L Laxton
*Assistant Examiner* — Peter Novak
(74) *Attorney, Agent, or Firm* — Bodi Law LLC

(57) ABSTRACT

An intelligent gate drive unit and related method for controlling one or more semiconductor switches of one or more power modules, the intelligent gate drive unit comprises at least a gate driver and an analog measuring circuit, wherein the gate driver facilitates control of the one or more semiconductor switches and wherein the analog measuring circuit facilitates measuring the switch voltage when the one or more semiconductor switches are in a conducting mode.

22 Claims, 6 Drawing Sheets

Figure 1:
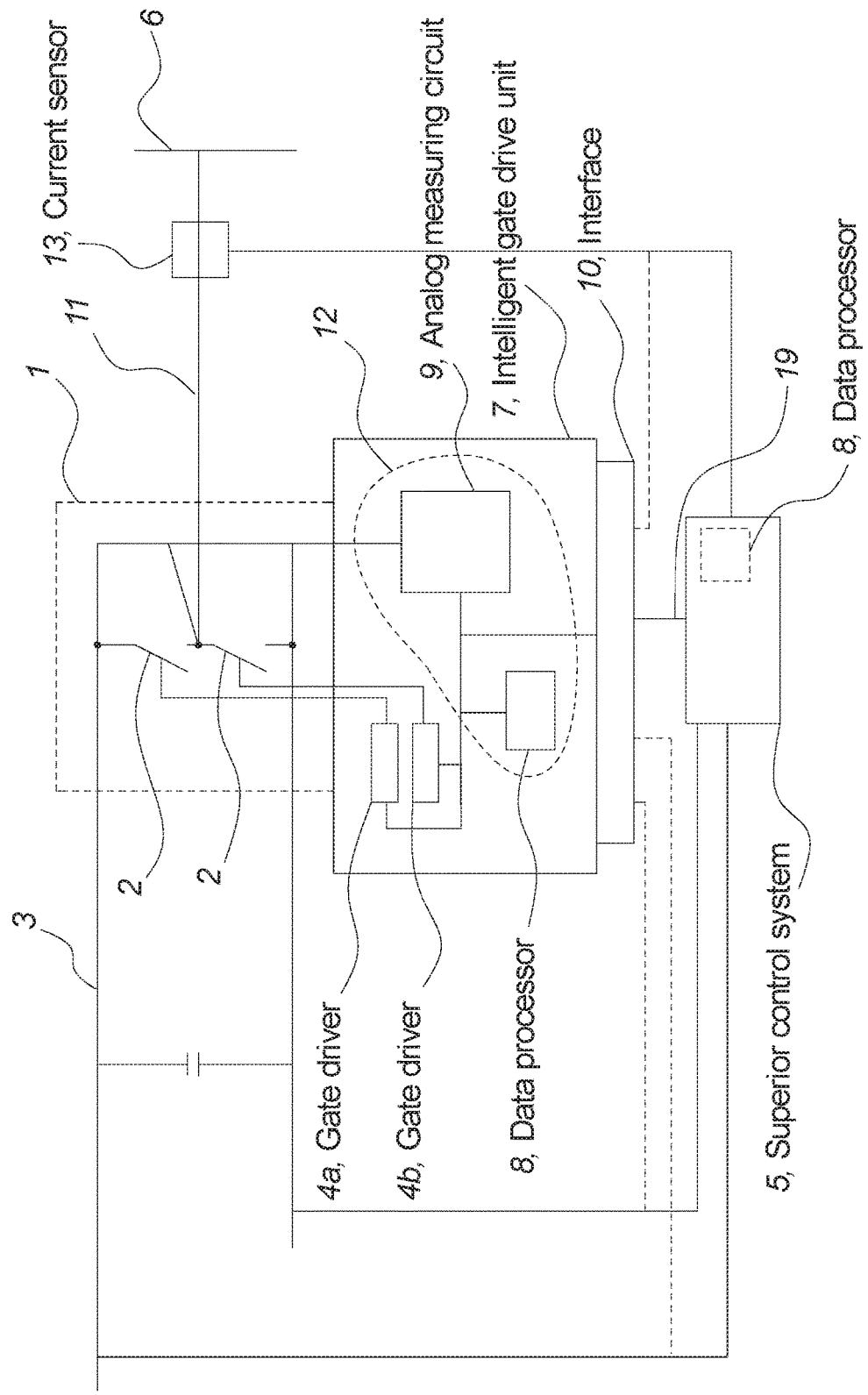

(51) Int. Cl.
*H03K 17/687* (2006.01)
*H02M 1/08* (2006.01)
*H02M 7/44* (2006.01)
*H03K 17/08* (2006.01)

(52) U.S. Cl.
CPC .......... *H02M 7/44* (2013.01); *H03K 17/6877* (2013.01); *H03K 2017/0806* (2013.01)

(56) References Cited

U.S. PATENT DOCUMENTS

| | | | |
|---|---|---|---|
| 6,275,093 B1 | 8/2001 | Shekhawat et al. | |
| 6,396,721 B1* | 5/2002 | Sonoda | H02M 3/33569 363/21.03 |
| 7,180,270 B2* | 2/2007 | Rufer | H02J 3/38 290/44 |
| 7,751,201 B2* | 7/2010 | Fujino | H02M 7/003 361/775 |
| 2002/0074974 A1* | 6/2002 | Shinba | H02H 7/1227 322/37 |
| 2007/0268642 A1* | 11/2007 | Metayer | H02H 3/087 361/93.1 |
| 2009/0021964 A1* | 1/2009 | Hsu | H02J 3/1842 363/41 |
| 2010/0066337 A1 | 3/2010 | Gong et al. | |
| 2011/0058296 A1 | 3/2011 | Orchowski | |
| 2012/0200320 A1 | 8/2012 | Thalheim et al. | |
| 2013/0257177 A1* | 10/2013 | Jacobson | H02M 1/08 307/115 |

FOREIGN PATENT DOCUMENTS

| | | |
|---|---|---|
| WO | 9919974 A2 | 4/1999 |
| WO | 2006102930 A1 | 10/2006 |
| WO | 2014154221 A2 | 10/2014 |
| WO | 2014154221 A3 | 10/2014 |

OTHER PUBLICATIONS

"Driver Solutions for High-voltage I GTSs"—Heinz Ruedl and Peter Kohli—CT-Concept Technologie AG—Renferstrasse 15, 2504 Biel-Bienne, Switzerland—12 pages—Cited in PCT International Search Report.
PCT International Search Report—Applicant: KK Wind Solutions A/S—International Application No. PCT/DK2014/050072—Date of Actual Completion of International Search Report: Nov. 24, 2014—International Search Report: dated Jun. 2, 2015.

* cited by examiner

GATE DRIVE UNIT WITH ANALOG MEASURING CIRCUIT

CROSS-REFERENCES TO RELATED APPLICATIONS

This application is the national phase of International Application No. PCT/DK2014/050072 filed on Mar. 26, 2014, which claims the benefit of priority to Danish Application No. PA 2013 00190 filed on Mar. 27, 2013, the entire disclosures of which are incorporated herein by reference.

FIELD OF INVENTION

The invention relates to an intelligent gate drive unit for controlling a power module comprising one or more semiconductor switches.

BACKGROUND OF THE INVENTION

Power modules are known in the art and used as switches or rectifiers in power electronic circuits for controlling the power flow from a generator of a renewable power generating unit to the electrical grid.

The application in which the power modules are used may produces power and the closer to design limits the more power may be produced.

Such power modules can be protected by the way they are controlled i.e. most likely the lifetime of a power module which has been controlled close to its design limits are shorter than a power module which has been controlled according to an operation margin or safety margin which is lower than the design limit. In other words overload capabilities are limited by predefined current-time pattern which means large operation margin for overload.

International patent application WO 99/19974 A2 describes a power application circuit utilizes microelectromechanical (MEM) switches to reduce power loss in energy conversion equipment having a gate drive controlling the MEM switch.

In addition the state of the art includes the following patent applications. US patent application US 2010/0066337 A1 describes a power converter comprising a controller configured to estimate a terminal voltage of the power converter. European patent application EP2469710 A1 describes a power switch current estimator at a gate driver. US patent application US 2011/0058296 A1 describes a method of detecting a fault condition of a load device controlling the amount of power delivered to an electrical load. International patent application WO 2006/102930 A1 describes an electronic switch circuit connected to control means, a detector sensing current flow at terminals of the electronic switch and means for monitoring offset error of the detector.

SUMMARY

It may e.g. be an object of the present invention to provide measurements facilitating reduction of unnecessary safety margins when controlling power modules. This is accomplished by an intelligent gate drive unit for controlling one or more semiconductor switches of one or more power modules, the intelligent gate drive unit comprise at least a gate driver and an analog measuring circuit, wherein the gate driver is configured for control of the one or more semiconductor switches and wherein the analog measuring circuit is configured for measuring a switch voltage when the one or more semiconductor switches are in a conducting mode.

A semiconductor switch is capable of closing an electric circuit and thereby conducting a current (in the conducting mode or on mode) from a first leg (e.g. the collector) to a second leg (e.g. the emitter) of the semiconductor switch. Likewise the semiconductor switch is capable of breaking an electric circuit and thereby prevents current from flowing in the electric circuit (in the non-conducting mode or off mode). The semiconductor switch are typically an IGBT switch but could also be a MOSFET, GTO, IGCT, thyristor, a silicon carbide switch, etc.

The mode of the semiconductor switch is controlled by a gate driver. The gate driver of the intelligent gate driver unit is communicating with a superior control system in order to obtain the desired switching pattern and thereby output from the power module. The gate driver unit being intelligent in that it facilitates measurements and data processing. Hence the intelligent gate driver facilitates/is configured for controlling e.g. generating pulse width modulation signal for the semiconductor, initiate and perform measurements directly at the semiconductor switch as described below.

The analog measuring circuit may comprise filters, differential amplifiers etc. for measurements of the analog signals. In addition the analog measuring circuit may include a semiconductor device for blocking of the high voltage across the IGBT during off state and thereby facilitates measurements directly on the individual semiconductor switches. Hence it becomes possible to measure the voltage drop over the semiconductor switch i.e. switch voltage over the collector and emitter (in case the switch is of the type IGBT) also referred to as Vce.

Performing measurements directly on the individual semiconductor switch or power modules are very advantageous in that the actual real time values are obtained which can be used for real time diagnostic (state of health, fatigue level, end of lifetime, etc.) of the semiconductor switch, power module, load resistor, estimate temperature in conducting mode, estimate wearout, measure overvoltage, measure leakage current, etc.

It may be very advantageous that the intelligent gate drive unit receives (some measurements e.g. from the superior control system) and/or obtains (most) measurements by means of the analog measuring circuitry. These measurements are processed and one result of the processing might be the condition of the semiconductor switch, how to control the semiconductor switch best possible, predict the near future (measured in nano or milli seconds) conditions of the semiconductor switch, etc.

In an embodiment of the invention the measuring circuit further facilitates measuring the switch voltage in a switching mode. This preferably includes the transient turn off voltage peak during switching (i.e. in the switching mode).

In an embodiment of the invention the measuring circuit further facilitates measuring the switching voltage in a non-conducting mode. It may be advantageous to be able to measure the switch voltage in off state (non-conducting mode). The off state voltage may give information of high leakage current. The transient turnoff voltage may indicate high stress or state of health of semiconductor switch (including diode).

In an embodiment of the invention, the analog measuring circuit includes means such as a semiconductor device for blocking the high voltage across the semiconductor device during the non-conducting mode. This is advantageous in that this facilitates measurements directly on the individual semiconductor switches making it possible to measure the voltage drop over the semiconductor switch In an embodiment of the invention, the measurements from the analog measuring circuit include measuring power module output current and/or DC-link voltage.

It may e.g. be advantageous to be able to measure DC-link voltage at the intelligent gate drive unit in that this facilitates calculation of e.g. brake chopper resistor resistance and the deviated resistor temperature. Further the DC-link voltage can be used to manipulate gate drive resistors, active clamping circuitries, etc.

In an embodiment of the invention, the intelligent gate drive unit further comprises a data processor facilitating calculation of semiconductor switch junction temperature at the intelligent gate drive unit.

It may be advantageous to include a data processor in the intelligent gate drive unit because this may e.g. facilitate control of power module, calculations, etc. independent of the superior control system. Hence resources from the superior control system may be released for other purposes, less data communication between intelligent gate drive unit and superior control system is required, less requirements to synchronization of time between the intelligent gate drive unit and the superior control system is required, etc.

Furthermore synchronization may be advantageous in that it e.g. facilitates comparison/aggregation of voltage and current measurements in the time domain.

The data processor may be a conventional microprocessor, Digital Signal Processor, etc.

Furthermore it should be mentioned that the intelligent gate drive unit also may comprise an analog to digital converter for converting the analog measurements to a digital representation.

In an embodiment of the invention, the one or more power modules is/are part of an inverter or part of a brake chopper.

An inverter should be understood as part of a converter for converting electric power from a renewable power generating unit so that the power can be feed to a utility grid. Such converter may comprise one or more inverters each comprising one or more power modules. Typically such inverters have more than one semiconductor switch.

A brake chopper should be understood as a module or electric circuit capable of absorbing power in case e.g. a grid disturbance causes the renewable power generating unit to lose grid connection. A brake chopper module may comprise one or more power modules, resistors, sensors, etc. A brake chopper is also in the art sometimes referred to as LVRT chopper, crowbar, dump load, etc. The brake chopper are preferably connected to the DC-link between the rotor side inverter and grid side inverter (of the converter) but could also e.g. be connected between the rotor (of the generator of the renewable power generating unit) and the rotor side inverter. Typically such chopper have only one semiconductor switch, but may also have two or more.

In an embodiment of the invention, the intelligent gate drive unit is configured for controlling the load conducted by the individual semiconductor switches. Such load control includes current control such as load sharing between the individual switches/power modules i.e. between the three phases of a three phase system.

In an embodiment of the invention, the data processor facilitates time synchronization between measurements of the switch voltage and an output current of the power module and/or measurements of the DC-link voltage and output current of the power module.

A superior control system should be understood as the main control system for the renewable power generating unit. In the case the renewable power generating unit is a wind turbine the superior control system would be referred to as the wind turbine controller (or simply WTC). The wind turbine controller is preferably responsible for the operation of the wind turbine including all sub-elements such as pitch, converter, yaw, etc. of the wind turbine.

Common understanding of time may be advantageous especially in a converter application in that the switching time of the semiconductor switches of the power module are very fast i.e. often measured in µs (micro seconds).

Furthermore when measurements are to be used in the same calculation e.g. of a temperature and the measurements are made partly by the intelligent gate drive unit and partly by the superior control system common understanding of the time (i.e. time synchronization between intelligent gate drive unit and superior control system) of measurement is important to calculate the correct temperature.

In an embodiment of the invention, the analog measuring circuit is further configured for measuring one or more of the list comprising: Vdc, output current of the semiconductor switch, gate current gate charge and/or gate voltage. Vdc is the voltage over the DC-link In an embodiment of the invention, the measurements from the analog measuring circuit facilitate estimation of at least one or more of the list comprising: semiconductor switch junction temperature, semiconductor switch baseplate temperature, brake chopper resistor temperature, fatigue level of semiconductor switch, fatigue level of brake chopper resistor, end of lifetime of semiconductor switch and/or end of lifetime of brake chopper resistor.

The present invention is e.g. very advantageous in that it may facilitate the mentioned measurements directly at the semiconductor switch or power module. Performing measurements directly on the individual semiconductor switch or power modules may be advantageous in that the actual real time values are obtained which can be used for real time diagnostic (state of health, fatigue level, end of lifetime, etc.) of the semiconductor switch, power module, load resistor, etc. in contrary to known methods which are based on estimated values.

In an embodiment of the invention, the data processor facilitates generation of a Pulse Width Modulation signal for controlling the one or more semiconductor switches of the one or more power modules and/or facilitates control of current through the one or more semiconductor switches of the power module.

This may e.g. be advantageous in that it allows the superior control system to completely leave control of power modules to the intelligent gate drive unit i.e. the superior control system only needs to request e.g. a desired output voltage from the power module from the intelligent gate drive unit. The intelligent gate drive unit then generates a Pulse Width Modulation controlling the power module so that it complies with the request from the superior control system. It should be mentioned that the data processor used for the time synchronization and for pulse width modulation does not necessary have to be the same data processor e.g. this task may be divided between two or more data processors.

Furthermore it may be advantageous to be able to let the intelligent gate drive unit manage the load conducted by the individual switches. Such current control also includes load sharing between the individual switches/power modules i.e. between the three phases of a three phase system.

In an embodiment of the invention, the intelligent gate drive unit facilitates overcurrent protection and/or overtemperature protection of the one or more semiconductor switches.

This may be advantageous in that such protection is based on measurements performed directly on the semiconductor switches or power modules and therefore is such measuring results can be used real time, (i.e. as soon as the measurements are made) without converting and transmitted, etc.

In an embodiment of the invention, the switching behavior of the semiconductor switch is configured to be controlled by means of one or more gate resistors wherein the value of said one or more gate resistors are changed based on measured operational parameters controlling one or more gate resistor switches.

Operational parameters may be DC voltage, semiconductor (switch or diode) junction temperature, switch current (Icollector), etc. which when reaching a predefined threshold facilitates connecting the gate resistors to the gate signal. The operational parameters may be made by the intelligent gate drive unit or the superior control system.

The manipulation/control of the switch may influence the switching behavior i.e. switching speed (faster or slower), switching procedure from initiating a switching to the switching is done, etc. the switching behavior may be manipulated or controlled by changing how and when one or more gate resistors are connected to the gate of the switch.

It may be advantageous that the intelligent gate drive unit receives (some measurements e.g. form the superior control system) and/or obtains (most) measurements by means of the analog measuring circuitry. These measurements are processed and one result of the processing might facilitate coupling in or out one or more gate resistors.

In an embodiment of the invention, overvoltage protection of the semiconductor switch is configured to be disabled by means of an active clamping switch based on measurement of operational parameters.

Operation parameters may be DC voltage, gate signals (ON/OFF of control signal to the semiconductor switch), switch current (Icollector), timing (i.e. time since last time switch was on or off), etc. The operational parameters may be made by the intelligent gate drive unit or the superior control system.

It may be advantageous that the intelligent gate drive unit receives (some measurements e.g. form the superior control system) and/or obtains (most) measurements by means of the analog measuring circuitry. These measurements are processed and one result of the processing might be enable or disable the active clamping function.

In an embodiment of the invention, overcurrent protection of the semiconductor switch is configured to be disabled by means of a saturation switch based on measurements of operational parameters.

Operational parameters may be switch current (i.e. Icollector the current which conducted by the switch, gate signal (on/off of control signal to the switch), timing (i.e. time since last time switch was on or off), etc. The operational parameters may be made by the intelligent gate drive unit or the superior control system.

Overcurrent may be high currents such as short circuit currents which may be up to and above 500% of rated current depending on the situation.

It may be very advantageous that the intelligent gate drive unit receives (some measurements e.g. form the superior control system) and/or obtains (most) measurements by means of the analog measuring circuitry. These measurements are processed and one result of the processing might be a voltage (e.g. Vice) based on which a saturation function i.e. overcurrent protection can be enabled or disabled.

In an embodiment of the invention, the intelligent gate driver unit is configured to communicate with a superior control system in order to obtain a desired switching pattern and thereby a desired output from the power module. In addition this communication may also include exchange of measurements between the intelligent gate driver and superior control system.

In an embodiment of the invention, the control performed by the intelligent gate drive unit is made based on measurements obtained from the analogue measuring circuit and/or from data received from the superior control system. Data from the superior control system could advantageously also e.g. be measurements made or initiated by the superior control system, control parameters, etc.

In an embodiment of the invention, the control performed by the intelligent gate driver could at least include one or more of the list comprising: enable the active clamping function, disable the active clamping function, change value of gate resistor (by means of gate resistor switches 26), load sharing in power modules, turn on the semiconductor switch, turn off the semiconductor switch.

Moreover the invention relates to a printed circuit board comprising an intelligent gate drive unit according to any of the claims 1-19 for controlling one or more semiconductor switches of one or more power module.

This may be advantageous in that such printed circuit board facilitates the above described measurements. The gate driver is mandatory in order to be able to control the semiconductor switch and if both the data processor and the analog measurement unit also are located on the printed circuit board less data transmission is needed.

It should be mentioned that the data processor could be located on another printed circuit board than the gate driver and the analog measurement unit, but that this would require more data to be communicated from the printed circuit board i.e. this would increase the demand to the data communication path to and from the printed circuit board.

In an embodiment of the invention, the intelligent gate drive unit comprises one analog measuring circuit and at least one gate driver for controlling one or more switches of one or more power modules.

This may be advantageous in the situation where a power module includes e.g. two semiconductor switches. In this situation the intelligent gate drive unit only needs to include two gate drivers and one analog measuring circuit and one data processor in that it is possible to connect the analog measuring circuit to the common point between the two switches which in practice would return one measurement with a negative operational sign.

Again it would be possible to locate the data processor external to the printed circuit board comprising the gate drivers as described above.

Moreover the invention relates to a wind turbine comprising an intelligent gate drive unit as described in claims 1-19.

Moreover the invention relates to a wind turbine comprising one or more power modules of which semiconductor switches are controlled by an intelligent gate drive unit comprise by a printed circuit board as described in claims 20-21.

Moreover the invention relates to a method of controlling one or more semiconductor switches of one or more power modules by means of an intelligent gate drive unit, which intelligent gate drive unit comprise at least a gate driver and an analog measuring circuit, wherein the gate driver controls the one or more semiconductor switches, and wherein the analog measuring circuit measures a switch voltage when the one or more semiconductor switches are in a conducting mode.

In an embodiment of the invention the one or more semiconductor switches are controlled according the method of claim 24, by an intelligent gate drive unit according to any of the claims 1 to 23.

FIGURES

Figure 2:
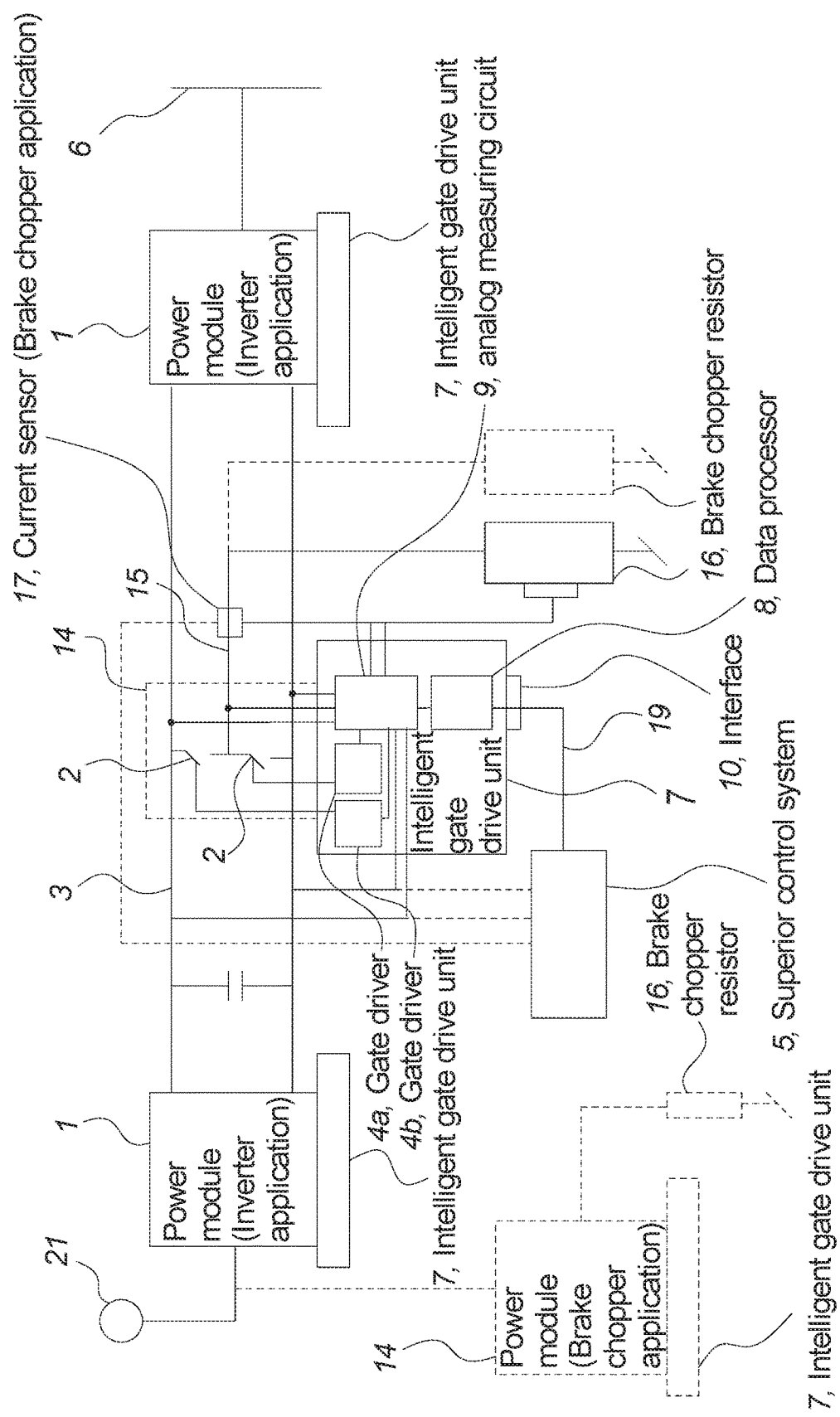
Figure 3:
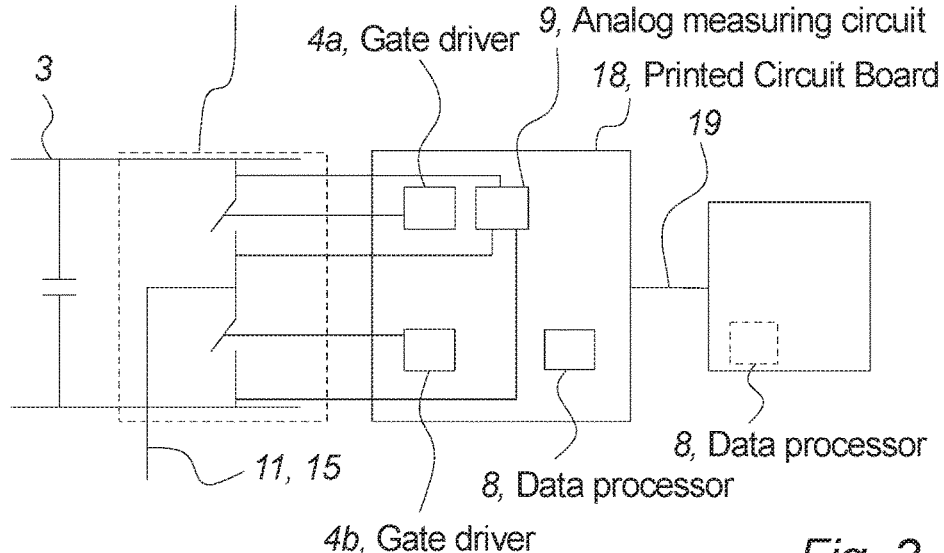
Figure 4:
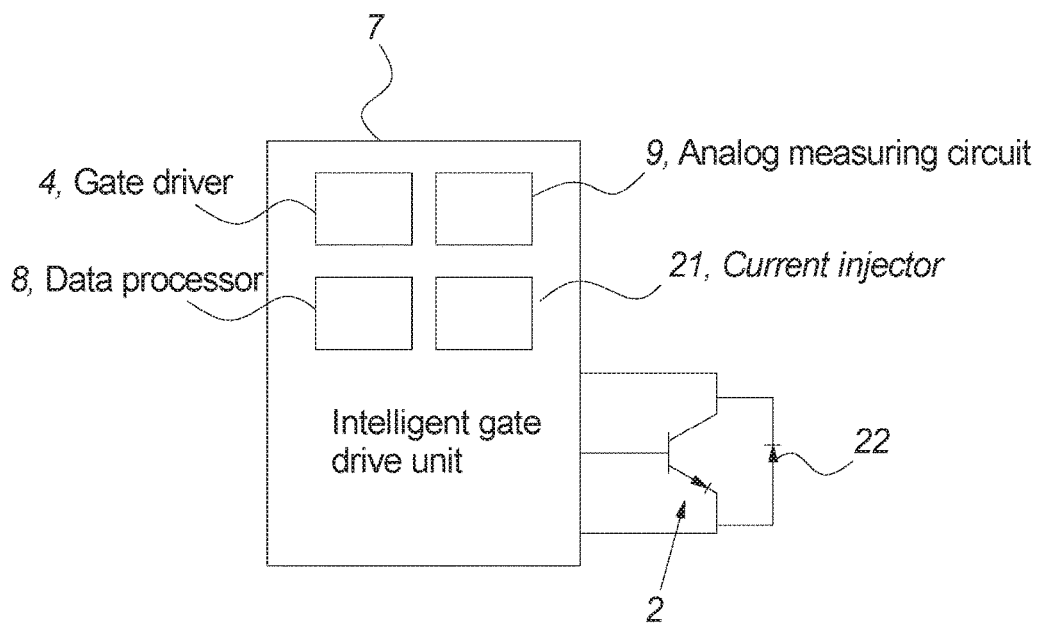
Figure 5:
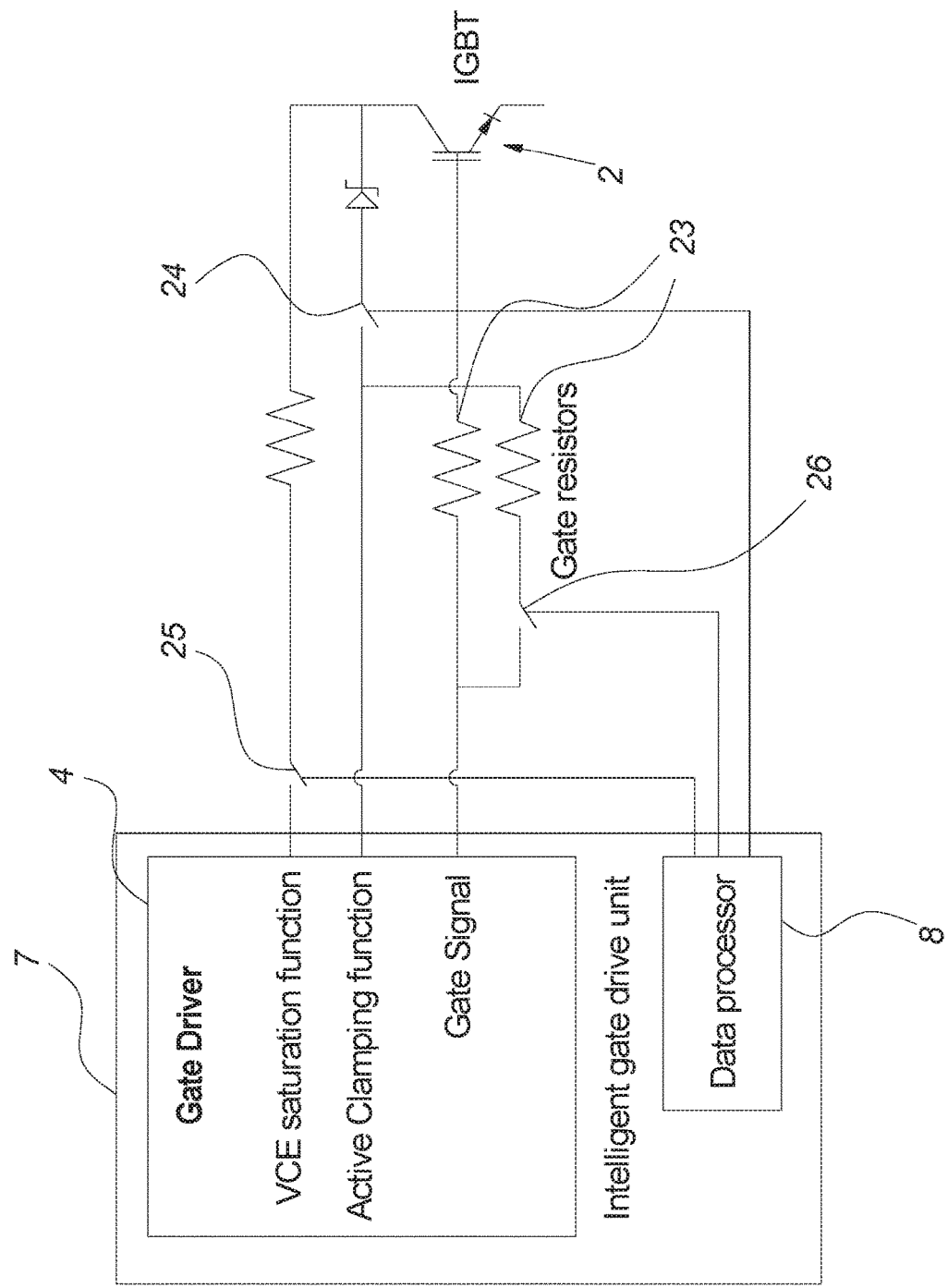
Figure 6:
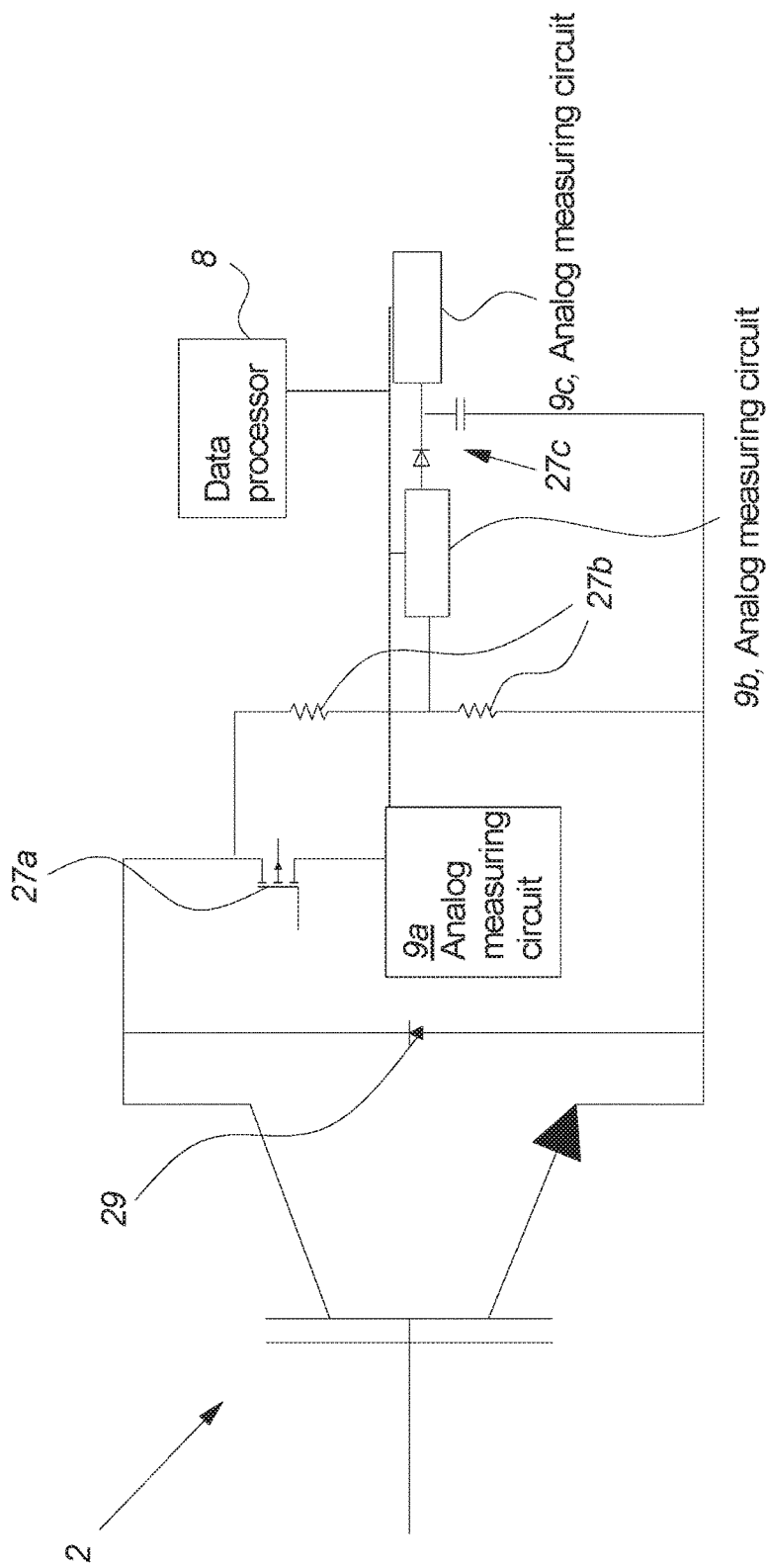
Figure 7:
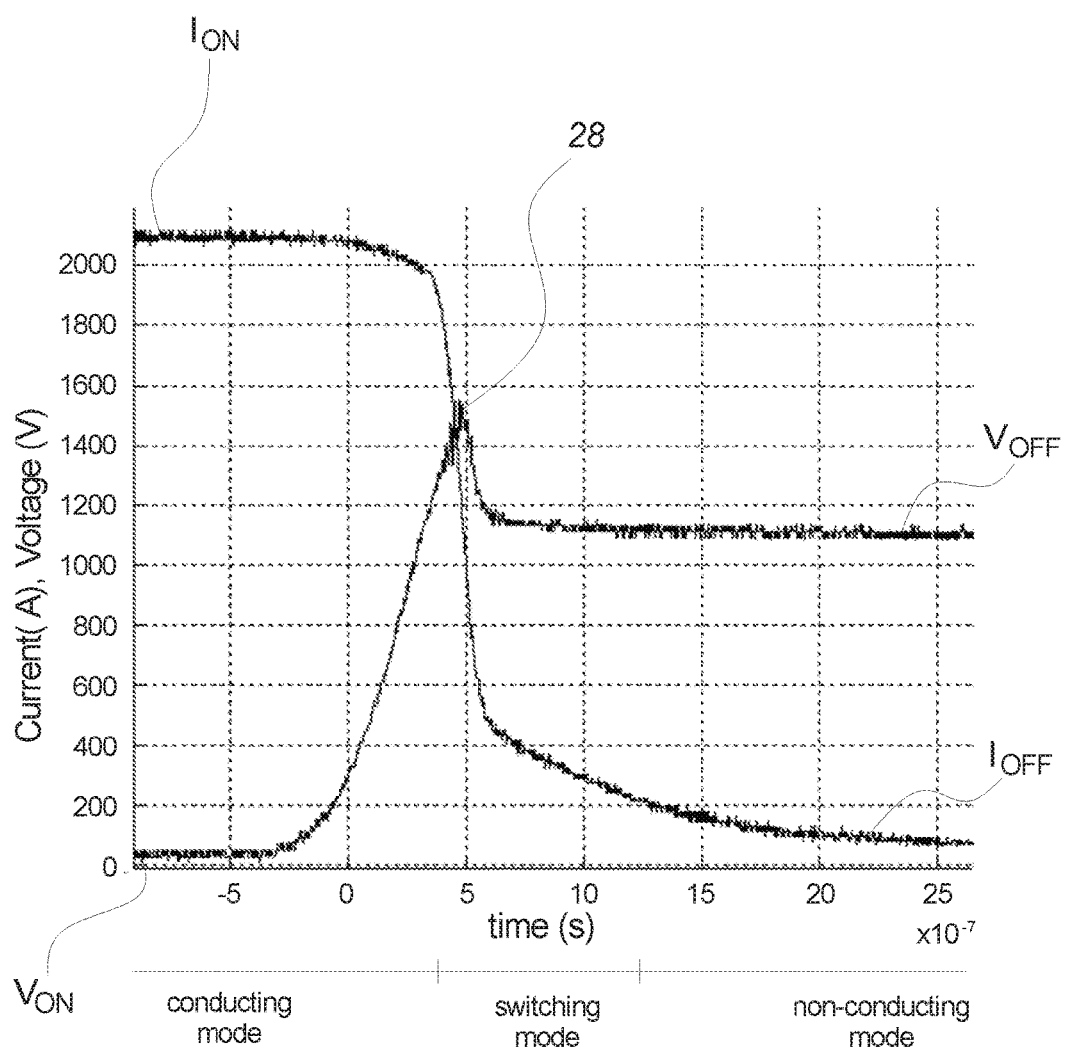

A few exemplary embodiments of the invention will be described in more detail in the following with reference to the figures, of which:

FIG. 1 illustrates the present invention implemented in the control of an inverter, FIG. 2 illustrates the present invention implemented in a brake chopper, FIG. 3 illustrates the present invention implemented on a printed circuit board, FIG. 4 illustrates the intelligent gate drive unit of the present invention facilitating calculation of junction temperature, FIG. 5 illustrates advantages obtained by use of the processing unit, FIG. 6 illustrates implementation of different measuring circuits and FIG. 7 illustrates a voltage/current plot.

DETAILED DESCRIPTION

FIG. 1 illustrates a part of a converter which is connecting a renewable power generating unit such as a wind turbine to the utility grid 6. Such converter may comprise a generator/machine side inverter (not illustrated) and a grid side inverter which is illustrated by a power module comprising two semiconductor switches 2. The generator side inverter and the grid side inverter are connected to each other by a DC-link 3. Each of the inverters may comprise one or more power modules comprising one or more switches.

The power module is controlled so as to shape the power produced by the renewable power generating unit to comply with predefined requirements e.g. in relation to the grid frequency and voltage. The semiconductor switches 2 are typically Insulated Gate Bipolar Transistors (IGBTs) but other types of semiconductor switches 2 could also be used (such as e.g. IGCT, Thyristors, GTO, Silicon Carbide switches, etc.). The semiconductor switches 2 may be grouped together in a power module hence an inverter may comprise one or more power modules.

Throughout this description power modules are referred to as inverter power module 1 (typically with reference to FIG. 1) and chopper power module 14 (typically with reference to FIG. 2) or simply power modules. It should be mentioned that the (inverter and chopper) power modules 1, 14 could be completely identical both in design, functionalities, data to be measured, processed, communicated, etc. The individual switches 2 of the power modules 1, 14 are preferably each controlled by a gate driver 4 but more than one switch could also be controlled by a single gate driver 4.

It should be noted that other components or circuitries such as e.g. filters, inductors, resistors, capacitors, diodes, etc. may be required to be able to obtain the desired control of the converter. This also includes additional switches being part of resistive network for dumping of power as will be described below.

Preferably the power modules 1 i.e. the switches are each controlled by a gate driver 4a, 4b. The gate drivers 4 are typically using Pulse Width Modulation (Pulse Width Modulation; PWM) to generate the control signal turning the semiconductor switch 2 on and off (according to a switching pattern e.g. dictated from a superior control system 5). Such gate drives 4 may also have additional functionalities or features such as short circuit protection, overvoltage control, etc. and comprise a gate controlling circuit, a switch mode power supply, an interface 10 (optical or electrical) to an additional control system 5, logic preventing shoot through, overcurrent minimum dead time, etc.

The generator side inverter receives an AC input voltage from a generator 20 and converts this voltage to a DC voltage. The grid side inverter receives the DC voltage via the DC-link 3 and converts the DC voltage into an AC voltage which is adapted and provided to the grid 6.

During grid disturbances where the renewable energy generating unit are not able to deliver produced power to the grid 6 it is known to dump this exceeding power in a crowbar or DC-chopper. The latter also sometimes referred to as a brake chopper.

Control of a converter as described above is considered common general knowledge for a person skilled in the art of converter control and will therefore not be explained further.

An embodiment of the invention where a power module of an inverter i.e. an inverter power module 1 is controlled by the intelligent gate drive unit 7 of the invention will now be described. The semiconductor switches 2 of the inverter power module 1 are controlled by means of an intelligent gate drive unit 7. The intelligent gate drive unit 7 preferably includes at least one gate driver 4 for each semiconductor switch 2, a data processor 8 and an analog measuring circuitry 9. The intelligent gate drive unit 7 is provided with a communication interface 10 (hardware) enabling the intelligent gate drive unit 7 to communicate with a superior control system 5 of the renewal power generating unit.

Communication from the intelligent gate drive unit 7 e.g. to a superior control system 5 could e.g. be raw measurement data such as DC-link 3 voltage, output current 11 (of power module), gate voltage (Vice in case the switch is an IGBT), etc. Based on such raw measurement data the superior control system 5 is able to determine the load, state, etc. of the switches 2 of the power module 1.

Alternative communication from the intelligent gate drive unit 7 could e.g. be processed data i.e. raw measurement data which is filtered, averaged, etc. Such processed data could be junction temperature of semiconductor switches 2/power module 1, fatigue level (i.e. remaining lifetime estimate or current health) of switches 2/power module 1, etc.

The more processing performed in the intelligent gate drive unit 7 the less data has to be communicated from the intelligent gate drive unit 7.

The above description of communication from the intelligent gate drive unit 7 also applies to at least the embodiment described in FIG. 2.

It should be mentioned that one gate driver 4 may be able to control more than one semiconductor switch 2 and that the data processor 8 may be physically located outside the intelligent gate drive unit 7. An example on the latter could be as part of the superior control system 5 as indicated by the dashed line 8.

The superior control system 5 may referrer to the control system of the entire renewable power generating unit. In case the renewable power generating unit is a wind turbine the superior control system 5 may be referred to as a wind turbine controller.

Furthermore it should be mentioned that the intelligent gate drive unit 7 also may include an Analog to Digital converter (not illustrated) for use e.g. to converter analog singles from the analog measuring circuitry 9 to the data processor 8 if necessary.

The data processor 8, the analog measuring circuitry 9 and an Analog to Digital converter (if any) together forms a data processing circuitry 12 for performing measurements, processing, analysis and estimations relating to the inverter power module 1 and its surroundings. It should be mentioned that the data processor 8 may be part of a data processing circuitry 12 which has embedded analog measuring circuit, an Analog to Digital converter, etc.

The measurements are performed by the analog measuring circuitry 9 and may include voltage (such as e.g. Vice (collector/emitter voltage over the individual semiconductor switches 2 or over inverter power module 1 when these are in a conducting mode, gate voltage, Vdc (DC-link 3 voltage), etc., current (such as e.g. output of semiconductor switch 2 or inverter power module 1, gate current, etc.), temperature (such as e.g. baseplate temperature of individual semiconductor switches 2 or power modules 2, ambient temperature of power module, temperature of cooling fluid, etc.)

Depending on the type of semiconductor switch 2 the voltages and currents may be referred to differently hence in this description the term "switch voltage" at least refers to the voltages:
Vce for IGBT (collector-emitter), Vce for Bipolar Transistor, Vds for MOSFET (drain-source), Vak for Thyristor (anode-kathode), Vge/Vgate (gate voltage) (IGBT/MOSFET), Vbe (base voltage) (Bipolar Transistor), Vgk (gate kathode) (Thyristor)

In the same way the current through the semiconductor switches 2 may be referred to by the term "switch current" which at least refers to the currents: Igate (Thyristor), Ibase (Bipolar Transistor), etc.

It should be noted that the intelligent gate drive unit 7 of the invention facilitates measurements of the voltage such as Vce and currents such as collector current (Ic), Igate, Ibase etc.

With this said it should be noted that even though above only semiconductor switches are mentioned measurements could be made related to all types of semiconductors also including diodes which are often used in configurations with semiconductor switches. Hence when reference is made to Vce this also includes Vka (for a thyristor), Vds (for a mosfet), Vf (forward voltage for a diode), etc.

It should be mentioned that the above may also be referred to operational parameters.

The processing (e.g. including analysis and estimations) of the measurements are performed by the data processor 8. Such processing may result in knowledge of the semiconductor switch 2 junction temperature (of semiconductor switch 2 and diode (not illustrated)), temperature of the one or more inverter power modules 1, estimation of fatigue level and/or end of lifetime of the semiconductor switches 2 and inverter power modules 1. The calculations may also be done in the superior control system 5, based on the measurements done in the intelligent gate drive unit 7 or partly in the superior control system 5 and partly in the intelligent gate drive unit 7.

As mentioned it should be noted that the data processor 8 does not have to be physically located as part of the intelligent gate drive unit 7 to perform the above mentioned processing of measuring results. Though it is preferred in that a lot of data needs to be communicated to and from the intelligent gate drive unit 7 if not the data processor 8 is located at the intelligent gate drive unit 7. Alternatively additional data processors (not illustrated) for different tasks may also be part of the intelligent gate drive 7.

The measurements e.g. of the inverter power module output 11 is typically made by the superior control system 5 which is also illustrated on FIG. 1. It should be noted that the intelligent gate drive unit 7 facilitates measuring and processing the inverter power module output 11 (i.e. switch current also sometimes referred to as the current through the collector i.e. Icollector) by connecting the current sensor 13 to the intelligent gate drive unit 7 e.g. via the interface 10.

In the same way, typically measurement of the DC-link 3 voltage (Vdc) is controlled by the superior control system 5. The intelligent gate drive unit 7 of the present invention also facilitates performing this voltage measurement.

Hence a preferred objective with the embodiment of the invention illustrated on FIG. 1 is to measure the switch voltage (i.e. Vice for an IGBT) and switch current (i.e. power module output 11) and used these measurements for calculating the semiconductor switch 2/power module junction temperature and real time state of health of the semiconductor switch 2. This information enables driving the semiconductor switch 2 closer to its design limit.

The design limit defines e.g. the current the semiconductor switch 2 is designed to conduct, a maximum temperature of the semiconductor switch 2, etc. An example of driving to the design limit could be given by means of the temperature. If the design limit of a semiconductor switch 2 is 150° C. often a developer of a control system for the switch 2 would lower this design limit temperature to a first safety margin of e.g. 140° C. to be sure not to exceed the design limit temperature.

Known control of the switch 2 is at least partly based on a temperature model of the switch 2 taking into account various parameters such as load current through the switch 2, ambient temperature, frequency of use of the switch (i.e. has the temperature of the switch had a change to drop since last time it was on), etc. Since these parameters all are associated with uncertainty the designer of the control of the switch 2 would only use the switch as long as the temperature model estimates the temperature of the switch 2 to be below a temperature of a second safety margin of e.g. 130° C.

Hence the present invention facilitates driving the switch 2 closer to the temperature of the first safety margin in that the temperature of the semiconductor switch 2 according to the invention is not estimated based on a temperature model but instead based on accrual measurements of the switch 2 thereby a more reliable temperature can be calculated. In this case control according to the second safety margin could be said to be unnecessary.

Hence if the switch 2 is part of a power stack of an inverter, the availability of the inverter controlled by the intelligent gate drive unit 7 of the present invention has potential to have a higher availability than availability of inverters controlled by known gate drivers.

It should be noted that because the calculation of the temperature based on the principles of the present invention has proved to be very true to the accrual temperature even the temperature of the first safety margin could be increased i.e. the gap between the temperature of the first safety margin and the design limit temperature may be reduced.

FIG. 2 illustrates a brake chopper power module 14 located in a DC-link 3 between two inverter power modules 1. The brake chopper power module 14 is controlled by an intelligent gate drive unit 7 as described above in relation to FIG. 1. Hence the description of the embodiment of FIG. 1 also applies to the embodiment illustrated on FIG. 2.

The brake chopper facilitates protection of the renewal power generation unit (preferably a wind turbine) e.g. in the event of grid disturbances. The brake chopper power module 14 comprises as the inverter power module 1 one or more semiconductor switches 2. The brake chopper may comprise more than one brake chopper power module 14 which may comprise one or more switches. In case only one switch is present, i.e. an upper or a lower switch.

In case of a grid disturbance the brake chopper may create an electric circuit which conducts current from the DC-link 3 to one or more dump loads 16. This is to get rid of produced power when this cannot be supplied to the grid 6. In case of more than one dump load 16 control of load distributed on these dump loads 16 may be provided (this is not illustrated).

The brake chopper may also be used as overspeed protection during normal operation where the brake chopper can be used for braking.

Alternative or in addition (illustrated by dashed lines) a brake chopper may be located in front of the generator side inverter. The purpose and functionality of the brake chopper located in front the generator inverter is the same as describe above where the brake chopper is located in the DC-link 3. A brake chopper in this configuration may be referred to as a Crowbar The gate drive unit 7 can be implemented in the same way whether it is controlling an inverter power module 1 or a brake chopper power module 14 and it may be capable of performing the same measurements, processing, analysis and estimation of data. Hence only difference of the invention illustrated in FIGS. 1 and 2 is the use (as part of an inverter/as part of a brake chopper) of the power modules 1, 14.

In the brake chopper embodiment the brake chopper power module output 15, the temperature of the dump load 16, the switch voltage (Vice in case of an IGBT) and the DC-link 3 voltage (Vdc) are important to the intelligent gate drive unit 7 for controlling a brake chopper power module 14. This information may all be provided from measurements controlled or performed by the intelligent gate driver 7. Alternatively such measurements may e.g. be made from a superior control system 5.

Other relevant measurements related to the control of the brake chopper power module 14 could be ambient temperature, switch current, gate charge, etc.

The measurements may be used to estimate the temperature, fatigue level, end of lifetime, etc. of both switch (i.e. the so called virtual junction temperature also referred to as switch junction temperature or semiconductor junction temperature. These expressions also covers when the semiconductor switch refers to a diode as is the case from time to time) and the resistor 16 which is used to dump power as described above.

The brake chopper typically operate in short time only (typically measured in seconds), therefore more simple sensors (for measuring e.g. current and temperature) may be used. An example could be a high resistance shunt resistors for current measurement.

As is the case in relation to FIG. 1 the measurements described in relation to FIG. 2 can also be made by the superior control system 5 e.g. if data processor 8 e.g. is not part of the intelligent gate drive 7.

Hence a preferred objective with the embodiment of the invention illustrated on FIG. 2 is measuring Vdc, output current 15 of semiconductor switch 2/power module 14 and switch voltage and used these measurements to calculate junction temperature of semiconductor switch 2/power module 14 and resistance temperature of load resistor 16. In addition, fatigue level/lifetime of power module 14 may also be determined. This information/calculations provide the same advantages over prior art as described in relation to the embodiment illustrated on FIG. 1

FIG. 3 illustrates a printed circuit board 18 comprising components for controlling a power module 1, 14 comprising two semiconductor switches 2 according to a preferred embodiment of the invention. The components of the intelligent gate drive unit 7 i.e. gate drivers 4a, 4b, analog measuring circuitry 9 and data processor 8 are all located on the same printed circuit board communicating with a superior control system 5.

It should be noted that the data processor 8 may be located external to the printed circuit board 18 in necessary. This would increase demands to communication line between the printed circuit board 18 and the location of the data processor 8.

Further it should be noted that it is only necessary to have analog measuring circuit 9. More than one analog measuring circuit 9 could also be used (see FIG. 6 and description hereof) and the analog measuring circuitry 9 may comprise additional not illustrated modules or sensors depending on demands to the intelligent gate drive unit 7. The analog measuring circuit 9 illustrated on FIG. 3 is only illustrated with means for measuring Vice but as described above the analog measuring circuitry 9 may facilitate a plurality of different measurements in various modes of the semiconductor switch 2 (conducting mode, non-conducting mode and switching mode).

Preferably each power module has its own printed circuit board with an intelligent gate drive unit 7 as described above.

The communication link 19 between the intelligent gate drive unit 7, the superior control system 5, externally located data processor 8, etc. is preferably done via conventional industrial data communication systems known by the skilled person. The communication link 19 facilitates one or two way signal bus between the superior control system 5 and the intelligent gate driver unit 7/printed circuit board 18.

It should be noted that an object of the invention is to measure all relevant signals at the intelligent gate drive unit 7. With this said some measurement may be made both by means of the intelligent gate drive unit 7 and the superior control system 5. In some situations relevant measurements are present in the superior control system 5 and these measurements may be send to the intelligent gate drive unit 7 or alternatively information from the intelligent gate drive unit may be sent to the superior control system 5 for processing. Processing could e.g. be calculating the junction temperature of the switch 2 which may require Vice and Icollector.

The superior control system 5 may provide gate control signals (switch on/off signal), to the intelligent gate drive unit 7.

Typically the superior control system 5 dictate the on/off of the semiconductor switches 2 by communicating on/off signals. It should be mentioned that the intelligent gate driver unit 7 could, based on the available measurements, make the PWM generation. In addition, several control functions could be part of the intelligent gate drive unit 7, such as current sharing control and current control. In this case, the superior control system 5 will send the reference signals to the intelligent gate drive unit 7, while the PWM generation can be made locally at the intelligent gate drive unit 7.

The more control and measuring the intelligent gated unit 7 have to perform the more data processors may be needed. Hence additional data processors beside the data processor 8 may be needed.

The intelligent gate drive unit 7 may provide raw or filtered measurement data as described above, protection signals such as overcurrent, switch chip/load resistor overtemperature, shoot through, etc. to the superior control system 5.

As mentioned above the data processor 8 may be located in another physical location than the rest of the intelligent gate drive unit 7 e.g. as part of the superior control system 5. In this situation the time synchronization between the intelligent gate drive unit 7 and the superior control system 5 cannot be facilitated by the data processor 8 (as is the case where the data processor 8 is located on the printed circuit board 18 as illustrated on FIG. 3). The time synchronization is advantageous in that it enables correlation of measurements of e.g. voltage and current facilitating matching of a voltage and a current measurement in the time domain. Therefore the communication link 19 between the superior control system 5 and the intelligent gate drive unit 7 need to provide such time synchronization. Data communication system such as Ethercat (registered trademark of Beckhoff Automation GmbH) facilitates such time synchronization and could be used as communication link 19. It should be mentioned that dedicated communication scheme may also be used.

Synchronous time in superior control system 5 and intelligent gate drive unit 7 is important especially in the situation where switch voltage (Vec in case of IGBT switch) and output current measurement 11, 15 is not made by the same unit (e.g. by the intelligent gate drive unit 7 and the superior control system 5). This is because the current measurement and switch voltage must be paired (and measured at the same point in time) to calculate the most precise switch junction temperature, resistor temperature, etc. Hence the more synchronous time the more precise temperature can be calculated.

This is also one of the reasons why the present invention is advantageous in that it facilitates performing all measurements at the intelligent gate drive unit 7 and thereby the requirements to synchronization of time between the intelligent gate drive 7 and superior control system is lowered.

The invention as described throughout this document facilitates control of a converter of a wind turbine under normal operation and during grid distribution such as a Low Voltage Ride Through (Low Voltage Ride Through; LVRT) phenomenon.

In an embodiment of the invention there is no active cooling on the resistor 16 in that it is only "on" for few seconds at the time. In the same way the power module 14 of the brake chopper may also only be placed on metal plate i.e. no active cooling Because of the high currents (both during normal operation i.e. power producing operation but especially during faults such as LVRT) the temperature of the power module 1, 14 and the appurtenant printed circuit board 18 including the intelligent gate drive unit 7 is also high. To control this requires high degree of knowledge of thermic model, thermic behavior and design limits of the power module 1, 14 and the appurtenant printed circuit board 18 including the intelligent gate drive unit 7.

Known control of semiconductor switches 2 is based on thermic models and the better models the minor safety margins is needed hence the better utilization of the semiconductor switches is obtained. By means of the direct on semiconductor switch 2 measurements of the present invention the thermic models are in principle superfluous in that the actual (or real time) voltage and currents are known and if not measured the relevant temperatures (e.g. switch junction temperature and resistor temperature) can be calculated. Thereby it becomes possible to drive/load the semiconductor switches to the design limit with no safety margin. In practice load would be reduce before the design limit has been reached in that it may take time for the renewable power generation unit to derate production. Hence by implementing the intelligent gate drive unit 7 of the present invention it becomes possible exploit more of the capacity of the power module 1, 14 compared to conventional control based on thermic models The junction temperature of the power module 1, 14 can be calculated e.g. by means of the data processor 8 based on the Vec versus current characteristics of the switch 2 or diode 22. At high load currents the measured Vce may be influenced by the load current through the switch 2 or diode 22 due to voltage drop in bond wires and interconnects. The intelligent gate drive unit 7 may compensate for these extra voltage drops by calibrating the system (i.e. the Vce measurements) using a low current from a low current injector 21. In such a configuration the intelligent gate drive unit 7 includes a circuitry 21 for injecting a predefined current into the switch 2 or diode 22. The low current injection will be made when the switch 2 is not conducting any load current. By using a low current, the influence of bond wires and interconnects will be reduced. A low current will be below 10% of the load current. The intelligent gate drive unit 7 illustrated on FIG. 4 facilitate this calculation of junction temperature.

The embodiment of the invention illustrated on FIG. 4 is just one example of many measurements and calculations which can be facilitated by the intelligent gate drive unit 7. In fact everything which can be measured on a switch 2 can be measured from the intelligent gate driver unit 7.

This knowledge can be obtained from measurements made directly at the semiconductor switches 2, power modules 1,14 and/or printed circuit board 18 which is facilitated by the intelligent gate drive unit 7 as described above.

FIG. 5 illustrates advantage control of the semiconductor switch 2 by an intelligent gate drive unit 7 comprising a data processor 8. In a typical gate drive 4 for high power semiconductor switches 2 such as IGBTs there are several functions in addition to the basic driving of the IGBT 2. Such extra functionalities are Vice saturation detection for overcurrent protection and Active Clamping to protect the IGBT 2 from overvoltage during turnoff. A typical gate drive 4 has fixed turnon and turnoff resistors 23 (also referred to as gate resistors) for turnon/off of the IGBT 2.

By adding a data processor 8 to the intelligent gate driver unit 7, the above described functionalities can be manipulated depending on the conditions of the system, typically DC voltage and load current (Icollector).

Such manipulating actions could e.g. include:
Active clamping function can be disconnected by means of an active clamping switch 24 when the DC-link voltage is higher than the Active Clamping trigger voltage. Based on the DC-link voltage and IGBT gate state (ON/OFF), the data processor 8 can determine when to connect the active clamping circuitry again via the active clamping switch 24.

Under certain load conditions the Vce saturation function may be inadvertently triggered i.e. the saturation switch 25 is triggered. The data processor 8 may determine such situations and disconnect the Vce saturation functionality temporarily by means of the saturation switch 25.

The behavior of the IGBT 2 switching is at least dependent on load current, DC voltage and junction temperature. By knowing the relation between these conditions and switching of the IGBT 2, the data processor 8 may alter the gate resistors 23 for the IGBT by connecting/disconnecting one or more gate resistors 23 by means of one or more gate resistor switches 26. The manipulation of the gate resistors 23 may be different for turnon and turnoff of the IGBT 2. This manipulation may also be done directly at the gate driver output buffer e.g. by having two or more parallel output buffer stages. An output buffer sometimes also is referred to as transistors (at the gate driver 4).

It should be mentioned that the data processor 8 above may be replaced by a or a new additions data processing unit dedicated to these manipulating actions. Such (additional) data processing unit is preferably also located at the intelligent gate drive unit 7. Further it should be noted that the data processor 8 could be a microcontroller, Digital Signal Processor, FPGA or equivalent.

FIG. 6 illustrates measuring circuits 9a, 9b, 9c, data processor 8, semiconductor switch 2, diode 29 and electronic components 27a, 27b, 27c. FIG. 6 illustrates implementation of different measuring circuits 9a, 9b, 9c for measuring voltage over the semiconductor switch 2 which (either one, two or all three together) may be part of an implementation of the intelligent gate drive unit 7 of the present invention. Hence when referring to a measuring circuit 9 throughout this application, such measuring circuit could be implemented as illustrated on FIG. 6 and perform the above described measurements. Either as one single of the illustrated measuring circuits 9a, 9b, 9c or as combination of two or three of these measuring circuits 9a, 9b, 9c. The illustrated ways of implementing is only one possible way of a plurality of different possible ways of implementation of measuring circuits for measuring voltage across a semiconductor switch 2.

In addition, FIG. 6 also illustrates electronic components 27a, 27b, 27c necessary for blocking current, dividing voltage, etc. Again, FIG. 6 only illustrates one way of implementing the measuring circuits 9a, 9b, 9c and other or additional electronic components may be needed or would optimize measurements of the one or more measuring circuits.

The measuring circuit 9a facilitates measuring of $V_{ce}$ when the semiconductor switch 2 is conducting current i.e. voltage measurement in a conducting mode. The measuring circuit 9b facilitates measuring of $V_{ce}$ when the semiconductor switch does not conduct current i.e. voltage measurement in a non-conducting mode. The measuring circuit 9c facilitates measuring of $V_{ce}$ in the time voltage across the semiconductor switch changes state from a conducting mode to a non-conducting mode or vice versa i.e. voltage measurement in a switching mode. As mentioned electronic components 27a, 27b, 27c facilitates or optimizes the described voltage measurements.

As illustrated the measuring circuits 9a, 9b, 9c are communicating with a data processor 8 which as mentioned above are used to initiated measurements, analyse data, communicated with other data processors, etc.

FIG. 7 illustrates a plot of voltage V and current I when the semiconductor switch changes from a conducting mode to a non-conducting mode. According to the illustrated embodiment the semiconductor switch 2 conducts a current $I_{on}$ of approximate 2100 A with a voltage $V_{ce}$ of approximate 25V over the semiconductor switch 2 (at time −5). When the semiconductor switch 2 is in the non-conducting mode the current $T_{off}$ running through the semiconductor switch is approximate 100 A with a voltage $V_{ce}$ over the semiconductor switch of approximate 1100V (at time 25). It should be mentioned that in the ideal world $I_{off}$ and $V_{on}$ should be at least close to zero.

As described above measurements of $V_{ce}$ from measuring circuit 9a performed in the conducting mode could be used e.g. to reduce unnecessary safety margins when controlling power modules. Such measurement may be made by at least including a blocking switch such as a MOSFET 27a illustrated in FIG. 6. It should be mentioned that such MOSFET 27a is not a power electronic device as the semiconductor switch 2.

Measurement of $V_{ce}$ from measuring circuit 9b performed in the non-conducting mode could e.g. be used to indicate high leak current in the semiconductor switch 2. Such measurement may include electronic components capable of making a voltage division of e.g. 1:1000 as illustrated in FIG. 6.

The mode between conducting and non-conducting mode is in this document referred to as switching mode but are also sometimes referred to as turn off switching (illustrated on FIG. 7) or turn on switching. The definition of when the switching mode starts and ends are generally in the art known as 10%/90% of the actual load. A a non-limiting example of this could be if the semiconductor switch conducts 2200 A the conducting mode ends/switching modes starts 10% below the 2200 A i.e. when the switch conducts 1980 A. The switching mode ends/the non-conducting mode starts 90% below the 2200 A i.e. when the switch conducts 220 A. Alternatively the switching mode is defined by time from actuation of the switch is initiated which typically would be measured in microseconds. As an example the switching mode could be defined as starting from e.g. 3-10 μs measured from actuation of the semiconductor switch and ending e.g. 15-20 μs from actuation.

From FIG. 7 it is observed that a transient turn off voltage 28 is present (at time 5). Measurements from measuring circuit 9c relating to the transient turn off voltage 28 (e.g. drifting over time, maximum voltage, peak/transient time, etc.) may be advantageous in that from such measurement information of especially the diode 29 may be derived. Such information could include e.g. state of health of the diode 29.

Typically the transient turn off voltage only appears when the semiconductor switch 2 changes state from conducting to non-conducting mode. Therefore it is of most interest to measure in this turn-off switching mode (illustrated on FIG. 7) compared to the turn-on switching mode. Situations could occur where measurements in the turn-on switching mode are relevant. The measurement of the transient turn off voltage voltage may include electronic components 27c such as a diode as illustrated in FIG. 6.

Beside the optimized control facilitated by the measurement performed by the measuring circuit(s) 9, the measurements are very advantageous in relation to error detection and root cause analysis. This is especially true in situations where the root cause of the error is not obvious. In such situation data in particular measurement data from the intelligent gate drive is valuable in that these measurements are so called raw measurements i.e. performed directly at e.g. the switch 2 with no processing i.e. no information or time is lost from when the measurement were obtained. Furthermore the sample rate of the measurements may be adjusted to comply with the purpose of use of the measurements hence measurements may be made in GHz area (e.g. with 1 nanosecond between measurements)

The detailed implementation of electronic components 27, measuring circuits 9a, 9b, 9c, diode 19, data processors 8, etc. for the specific measurements is considered trivial for the person skilled in the art and therefore not disclosed in details in this document. Hence the different aspects of the described measuring circuit 9 could be implemented as one single measuring circuit or as two or more separated measuring circuits. The choice of implementation may vary depending on most relevant measurement, hardware, etc.

It should be mentioned that values to be measured may have very different values depending on the mode in which they are measured. Hence the measuring circuit 9 or parts hereof may give the desired measuring's in one mode whereas the measuring circuit 9 or parts hereof may e.g. be saturated in another mode. An example of the latter scenario could be measuring the diode voltage in the non-conducting state and in the conducting state. The result of such measuring in the non-conducting mode will be expected values whereas the result of measuring in the conducting mode will not be useful in that the measuring circuit 9 (or part hereof or separate measuring circuit depending on implementation) for such measurement will be in saturation. It should be mentioned that such non useful measurements e.g. due to saturation of components or circuits are interpreted as a measuring result.

As mentioned above reverence to a semiconductor switch 2 may also include reference to a diode such as the diode 29 illustrated in FIG. 6 in this case the switch voltage could be referred to as $V_d$ ($V_{diode}$). Typically the semiconductor switch 2 is IGBT (voltage referred to as $V_{ce}$), MOSFET/silicon carbide MOSFET (voltage referred to as $V_{ds}$) switches.

The reference number on the figures are the same as fare as the parts of the figures are identical which underlines that the illustrated embodiments are of the same invention and can be combined with no limitations. Further the intelligent gate drive of the present invention is not limited to the use as illustrated in the figures but could be used to control any kind of semiconductor switches in any suitable application.

Lines on the figures illustrating communication links 19 (and not numbered) are not limiting in that the need communications links 19 (and not numbered) are used when implementing the present invention. This also goes for the communication interface 10 which may be a hardware socket, a software protocol mapping data, etc. whatever needed to implement the present invention.

It should be noted that even though the invention throughout this description is describe in relation to a renewal power generation unit, the intelligent gate driver 7 can be used in control of switches in other applications.

Furthermore it should be noted that e.g. a power converter may include both the embodiment illustrated on FIG. 1 and the embodiment illustrated on FIG. 2. In fact all the embodiments described through this patent application could be implemented in the same embodiment i.e. be included in the same intelligent gate drive unit 7.

It should be noted that even though not illustrated in any of the figures (except for FIG. 4) often the switches 2 are used in a configuration with an antiparallel diode 22. The diode also being a semiconductor device as the switch 2 and the intelligent gate drive unit also facilitates measurements on such diode 22.

LIST

1. Power module (inverter application)
2. Semiconductor switch
3. DC-link
4. Gate driver
5. Superior control system
6. Utility grid
7. Intelligent gate drive unit
8. Data processor
9. Analog measuring circuit
10. Interface
11. Power module output (inverter application)
12. Data processing circuitry
13. Current sensor (inverter application)
14. Power module (Brake chopper application)
15. Power module output (Brake chopper application)
16. Brake chopper resistor
17. Current sensor (Brake chopper application)
18. Printed Circuit Board
19. Communication link
20. Generator
21. Current injector
22. Diode
23. Gate resistors
24. Active clamping switch
25. Saturation switch
26. Gate resistor switch
27. Electronic
28. Transient turn off voltage
29. Diode

What is claimed is:

1. An intelligent gate drive unit for controlling at least two semiconductor switches in a half-bridge configuration between an upper DC terminal and a lower DC terminal of a power module, the intelligent gate drive unit comprising:
   at least two gate drivers, each configured for controlling the switching of one of the at least two semiconductor switches;
   an analog measuring circuit configured to measure an analog voltage measurement of at least one of the at least two semiconductor switches in real time while the at least one of the at least two semiconductor switches is in a conducting mode, wherein
   the reference potential of the analog measuring circuit is the midpoint of the half-bridge such that the analog measuring circuit is configured for measuring the analog voltage of at least one of the at least two semiconductor switches between the midpoint of the half-bridge configuration and the upper DC terminal or between the midpoint of the half-bridge configuration and the lower DC terminal, and wherein
   the analog measuring circuit is further configured to output the analog voltage to a data processor, and further wherein
   the data processor is configured for receiving a signal which represents the output current of the half-bridge configuration; such that
   the processor is configured to calculate an estimated current temperature of at least one of the at least two semiconductor switches based on the analog voltage measurement taken during the conducting mode and based on the signal representing the output current of the half-bridge configuration.

2. The intelligent gate drive unit according to claim 1, wherein the analog measuring circuit further facilitates measuring the switch voltage in a switching mode.

3. The intelligent gate drive unit according to claim 1, wherein the analog measuring circuit further facilitates measuring the switching voltage in a non-conducting mode.

4. The intelligent gate drive unit according to claim 3, wherein said analog measuring circuit includes means such as a semiconductor device for blocking the high voltage across the semiconductor switch, which preferably is an IGBT, during the non-conducting mode.

5. The intelligent gate drive unit according to claim 1, wherein the measurements from the analog measuring circuit include measuring power module output current and/or DC-link voltage.

6. The intelligent gate drive unit according to claim 1, wherein the intelligent gate drive unit further comprises a data processor facilitating calculation of semiconductor switch junction temperature at the intelligent gate drive unit.

7. The intelligent gate drive unit according to claim 1, wherein the one or more power modules is/are part of an inverter or part of a brake chopper.

8. The intelligent gate drive unit according to claim 1, wherein the intelligent gate drive unit is configured for controlling the load conducted by the individual semiconductor switches.

9. The intelligent gate drive unit according to claim 1, wherein a data processor facilitates time synchronization between measurements of the switch voltage and an output current of a power module and/or measurements of a DC-link voltage and an output current of the power module.

10. The intelligent gate drive unit according to claim 1, wherein the measurements from the analog measuring circuit facilitate estimation of at least one or more of the list comprising: junction temperature of the semiconductor switch, baseplate temperature of the semiconductor switch, a brake chopper resistor temperature, fatigue level of the semiconductor switch, fatigue level of the brake chopper resistor, end of lifetime of the semiconductor switch and/or end of lifetime of the brake chopper resistor.

11. The intelligent gate drive unit according to claim 1, wherein the intelligent gate drive unit facilitates overcurrent protection and/or over temperature protection of the one or more semiconductor switches.

12. The intelligent gate drive unit according to claim 1, wherein the switching behavior of the semiconductor switch is configured to be controlled by means of one or more gate resistors, wherein the value of said one or more gate resistors is changed based on measured operational parameters controlling one or more gate resistor switches.

13. The intelligent gate drive unit according to claim 1, wherein overvoltage protection of the semiconductor switch is configured to be disabled by means of an active clamping switch based on measurement of operational parameters.

14. The intelligent gate drive unit according to claim 1, wherein overcurrent protection of the semiconductor switch is configured to be disabled by means of a saturation switch based on measurements of operational parameters.

15. The intelligent date drive unit according to claim 14, wherein the control performed by the intelligent gate driver at least includes one or more of the list comprising: enable an active clamping function, disable the active clamping function, change value of a gate resistor, load sharing in power modules, turn on the semiconductor switch, turn off the semiconductor switch.

16. The intelligent gate drive unit according to claim 1, wherein the intelligent gate drive unit is configured to communicate with a superior control system in order to obtain a desired switching pattern and thereby a desired output from the power modules.

17. The intelligent gate drive unit according to claim 1, wherein control performed by the intelligent gate drive unit is made based on measurements obtained from the analog measuring circuit and/or from data received from a superior control system.

18. A printed circuit board comprising an intelligent gate drive unit according to claim 1 for controlling one or more semiconductor switches of one or more power modules.

19. A wind turbine comprising one or more power modules of which semiconductor switches are controlled by an intelligent gate drive unit as described in claim 1.

20. The intelligent gate driver unit according to claim 1, wherein the data processor is part of a superior control system.

21. The intelligent gate driver unit according to claim 1, wherein the estimated current temperature is utilized by the processor for diagnosing a health status of at least one of the at least two semiconductor switches.

22. An intelligent gate drive unit for controlling at least two semiconductor switches in a half-bridge configuration between an upper DC terminal and a lower DC terminal a power module in a half-bridge configuration, the intelligent gate drive unit comprising:
    at least two gate drivers each of which configured for controlling the switching of one of the at least two semiconductor switches;
    an analog measuring circuit configured to measure an analog voltage of the one of the at least two semiconductor switches in real time while the one of the at least two semiconductor switches are in a conducting mode;
    wherein the reference potential of the analog measuring circuit is the midpoint of the half-bridge configuration such that the analog measuring circuit is configured for measuring the analog voltage of at least one of the at least two semiconductor switches between the midpoint of the half-bridge configuration and upper DC terminal or between the midpoint of the half-bridge and the lower DC terminal, and wherein the analog measuring circuit is further configured to output the analog voltage to a data processor; and
    wherein the processor is configured to calculate an estimated current temperature of at least one of the at least two semiconductor switches from the analog voltage, and wherein said estimated current temperature is utilized by the processor for diagnosing a health status of at least one of the at least two semiconductor switches.

* * * * *